US009973218B2

(12) United States Patent
Zhu et al.

(10) Patent No.: US 9,973,218 B2
(45) Date of Patent: May 15, 2018

(54) CIRCUITS TO ENABLE RECONFIGURABILITY (71) Applicant: Hewlett Packard Enterprise Development LP, Houston, TX (US)

(72) Inventors: Kehan Zhu, Palo Alto, CA (US); Cheng Li, Palo Alto, CA (US); Zhubiao Zhu, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days. days.

(21) Appl. No.: 15/266,574

(22) Filed: Sep. 15, 2016

(65) Prior Publication Data
US 2018/0076836 A1    Mar. 15, 2018

(51) Int. Cl.
| H04B 1/04 | (2006.01) |
| H04B 10/80 | (2013.01) |
| H03K 17/687 | (2006.01) |
| H04L 27/04 | (2006.01) |
| H01S 5/042 | (2006.01) |
| H03K 19/0175 | (2006.01) |
| H04B 10/54 | (2013.01) |

(52) U.S. Cl.
CPC ........... *H04B 1/04* (2013.01); *H03K 17/6872* (2013.01); *H04B 10/801* (2013.01); *H04L 27/04* (2013.01); *H01S 5/0427* (2013.01); *H03K 19/017509* (2013.01); *H04B 10/541* (2013.01)

(58) Field of Classification Search
CPC ... H01S 5/0427; H04B 10/541; H04B 10/801; H04B 1/04; H04L 27/04; G02F 1/025; H03K 17/6872
See application file for complete search history.

(56) References Cited

U.S. PATENT DOCUMENTS 9,229,250 B2 *  1/2016  Minoia ................... G02F 1/225

OTHER PUBLICATIONS

H. Sepehrian, L. Rusch and W. Shi, "Multi-stage 20 Gbaud driver in 130 nm CMOS for segmented Mach-Zehnder optical modulators," 2016 IEEE International Symposium on Circuits and Systems (ISCAS), Montreal, QC , 2016, pp. 201-204.*
T. N. Huynh et al., "Flexible Transmitter Employing Silicon-Segmented Mach—Zehnder Modulator With 32-nm CMOS Distributed Driver," in Journal of Lightwave Technology, vol. 34, No. 22, pp. 5129-5136, Nov. 15, 2016 (publication date as listed by IEEE is Sep. 7, 2016).*
M. Cignoli et al., "22.9 A 1310nm 3D-integrated silicon photonics Mach-Zehnder-based transmitter with 275mW multistage CMOS driver achieving 6dB extinction ratio at 25Gb/s," 2015 IEEE International Solid-State Circuits Conference—(ISSCC) Digest of Technical Papers, San Francisco, CA, 2015, pp. 1-3.*

(Continued)

*Primary Examiner* — Michelle M Koeth
(74) *Attorney, Agent, or Firm* — Hewlett Packard Enterprise Patent Department (57) ABSTRACT

An example device in accordance with an aspect of the present disclosure includes at least one segment driver circuit having a first circuit and a second circuit, to receive input signals and provide output signals. A given segment driver circuit is to protect reliability and enable reconfigurability by selectively resetting coupling capacitors, and selectively cutting off the input signals from their respective segment driver circuit.

16 Claims, 10 Drawing Sheets

(56) References Cited

OTHER PUBLICATIONS

H. Sepehrian, L. Rusch and W. Shi, "Multi-stage 20 Gbaud driver in 130 nm CMOS for segmented Mach-Zehnder optical modulators," 2016 IEEE International Symposium on Circuits and Systems (ISCAS), Montreal, QC, 2016, pp. 201-204.*
T. N. Huynh et al., "Flexible Transmitter Employing Silicon-Segmented Mach-Zehnder Modulator With 32-nm CMOS Distributed Driver," in Journal of Lightwave Technology, vol. 34, No. 22, pp. 5129-5136, Nov. 15, 2016 (publication date as listed by IEEE is Sep. 7, 2016).*
J. Prades, E. Kerhervé, A. Ghiotto and D. Pache, "0.3-42.5 GHz wideband common emitter amplifier driver unit in 55 nm SiGe BiCMOS for 60 Gb/s silicon photonic Mach-Zehnder Modulator," 2016 14th IEEE International New Circuits and Systems Conference (NEWCAS), Vancouver, BC, Jun. 29, 2016.*

* cited by examiner

CIRCUITS TO ENABLE RECONFIGURABILITY

STATEMENT OF GOVERNMENT INTEREST

This invention was made with government support under Contract No. H98230-14-3-0011 awarded by Maryland Procurement Office. The government has certain rights in the invention.

BACKGROUND

Silicon-based photonic integration can provide increased transfer bandwidth for computing communications. The use of increasing complexity of modulation formats, such as moving from non-return to zero (NRZ) to pulse amplitude modulation 4-level (PAM-4), can add complications in system design and circuit design.

DETAILED DESCRIPTION

It is desirable to have solutions that are capable of being flexibly configured, to enable NRZ and/or PAM modulation format features, as well as enabling different extinction ratio (ER) specifications for satisfying different application scenarios, to provide the best system performance in view of power consumption.

One type of silicon-based photonic integration device is a Mach-Zehnder Modulator (MZM) device. An MZM device needs a certain voltage swing to achieve a desired corresponding modulation depth. This leads to the use of circuits having a high voltage driver using low voltage metal-oxide-semiconductor field-effect transistors (MOSFETs), to provide faster speed. Such circuit designs can include latch-based level shifters, which can suffer potential reliability issues due to signal toggling. More specifically, the voltage received at a level shifter may jump between a large swing range, which will stress the gates of inverters of the level shifter. A capacitor, which can be used to couple the signal from a low voltage domain to a higher voltage domain, can introduce potential voltage overshoot and undershoot at the start of the signal toggling, due to uncertain initial voltage potential at the two plates/nodes of the capacitor (the voltage potential across the capacitor cannot change instantaneously). The overshoot or undershoot voltage can exceed a gate oxide breakdown voltage of the circuit components, which will result in reliability issues at transistors being connected to the capacitor.

To address such issues, example implementations described herein enable driver schemes that can be used, e.g., for segmented MZM transmitters, whose electronic circuitry (such as that based on complementary metal-oxide-semiconductor (CMOS)), can be used for segment photonic modulator drivers, e.g., to drive a lump-element segmented high-speed phase modulator. Example implementations of segmented MZM transmitters as described herein provide flexibility, based on providing reconfigurable modulation schemes and ERs, while also eliminating reliability issues that would be posed by stresses of excessive overshoot or undershoot associated with alternating current (AC) coupling capacitors. Additionally, example implementations of segment drivers can be selectively turned off to save power consumption as needed. Circuits for such segment drivers can be flip-chip bonded to the segmented high-speed phase modulator that is laid in a serpentine style, enabling reconfigurable MZM transmitters that can be flexibly configured to provide NRZ or PAM modulation formats while meeting different extinction ratio specifications.

Figure 1:
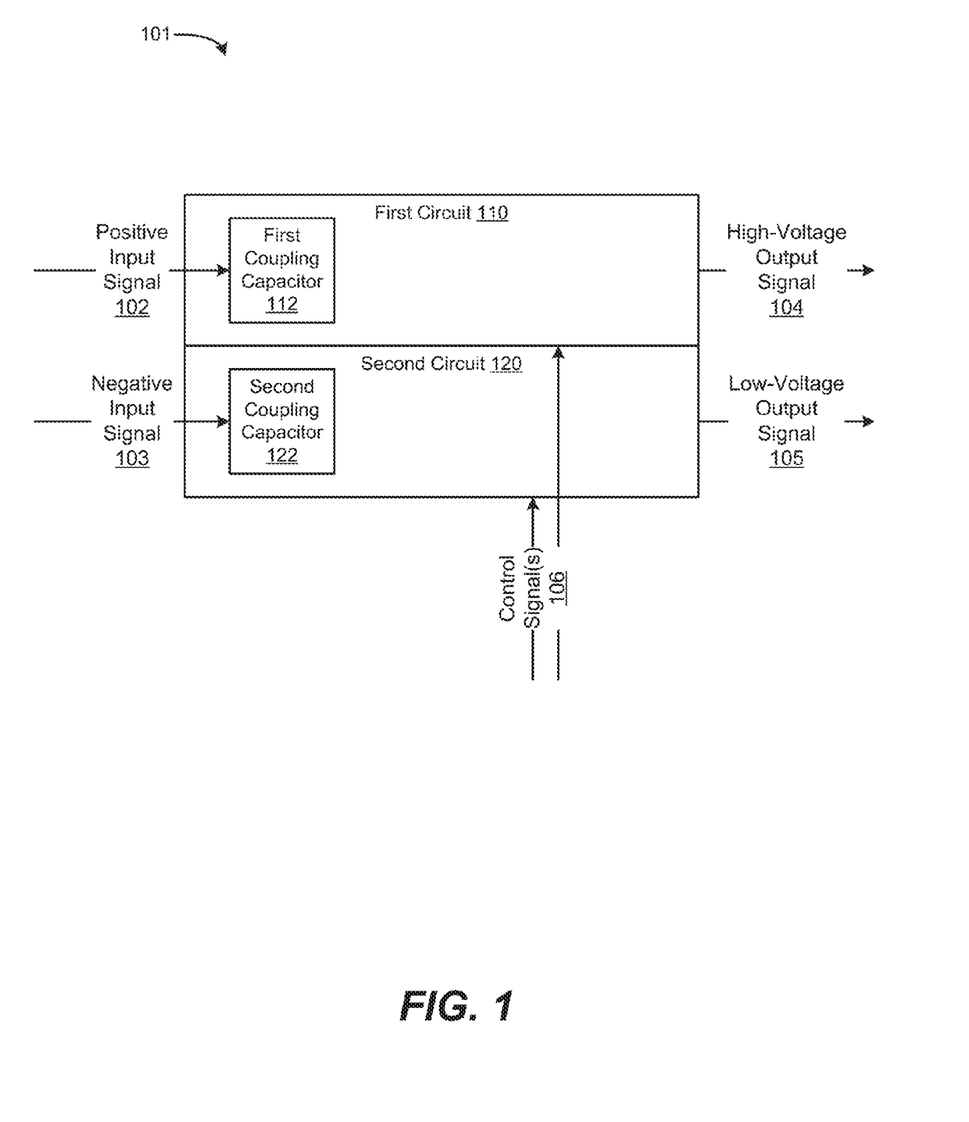
FIG. 1 is a block diagram of a segment driver circuit including a first circuit and a second circuit according to an example.

FIG. 1 is a block diagram of a segment driver circuit 101 including a first circuit 110 and a second circuit 120 according to an example. The first circuit 110 includes a first coupling capacitor 112, and is to receive positive input signal 102 and provide high-voltage output signal 104. The second circuit 120 includes a second coupling capacitor 122, and is to receive negative input signal 103 and provide low-voltage output signal 105. The first and second circuits 110, 120 are to receive control signals 106.

Such example implementations of a segment driver circuit 101 can be implemented using CMOS technology, to be used for driving a photonic device. However, there can be differences between the voltage signal needs of the electrical circuitry (e.g., lower-power CMOS) to effectively modulate the depletion mode phase modulators. For example, a Mach-Zehnder modulator (MZM) can need a relatively higher modulation voltage swing, compared to the input voltage swings received by the electrical segment driver circuits. In an example implementation, power supply voltages for advanced CMOS circuit operations can be on the order of 0.9 volts. However, a segment driver circuit is to provide an electrical modulation signal for, e.g., a Mach-Zehnder photonic device, which needs a voltage swing of on the order of 1.8 V (e.g., which can be modulated to provide desirable optical output amplitude). The 1.8 V usable by the photonic device in this example scenario can be double the voltage swing of the CMOS circuit power supply. Due to the use of capacitors and other circuit schemes, the higher 1.8 V can end up being applied to a transistor or other circuit component of the electronics, which are designed for operation at 0.9 V. Accordingly, over time, the electrical transistors can break down, failing to meet expected longevity design targets. The example circuit designs described herein can ensure that transistors and other components, which are designed to work at relatively lower voltages, will be protected from relatively higher voltages (e.g., those that meet the operation needs of photonic devices). Furthermore, the example circuit designs can enable the flexibly turning on and off of individual segment driver circuits of the Mach-Zehnder modulator, enabling configurability in modulation format, chosen extinction ratio, and power consumption.

The positive input signal 102 and the negative input signal 103 are complementary to each other, received by the segment driver circuit 101 to provide (for a high-speed phase modulator device) the high-voltage output signal 104 and the low-voltage output signal, which are also complementary to each other. The coupling capacitors 112, 122 are for matching the paths of the positive and negative input signals 102, 103. The segment driver circuit 101 is to protect reliability and enable reconfigurability of itself and devices incorporated the segment driver circuit 101. For example, in response to the control signal(s) 106, the segment driver circuit 101 is to selectively reset a charge of both plates of the first coupling capacitor 112 and the second coupling capacitor 122 before input signals 102 and 103 arrive. This prevents increased voltages from accumulating at the capacitors 112, 122. The segment driver circuit 101 also can selectively cut off the positive input signal 102 from the first circuit 110, and the negative input signal 103 from the second circuit 120. In an example implementation, the segment driver circuit 101 can reset the charge of the capacitors 112, 122 using a pull down circuit before and after a given capacitor. Resetting the charge also can be used to initialize the charge of the capacitors 112, 122 before circuit operation begins, to avoid risk of voltage overshoot and undershoot that might risk damaging the transistors in the circuitry.

Figure 2:
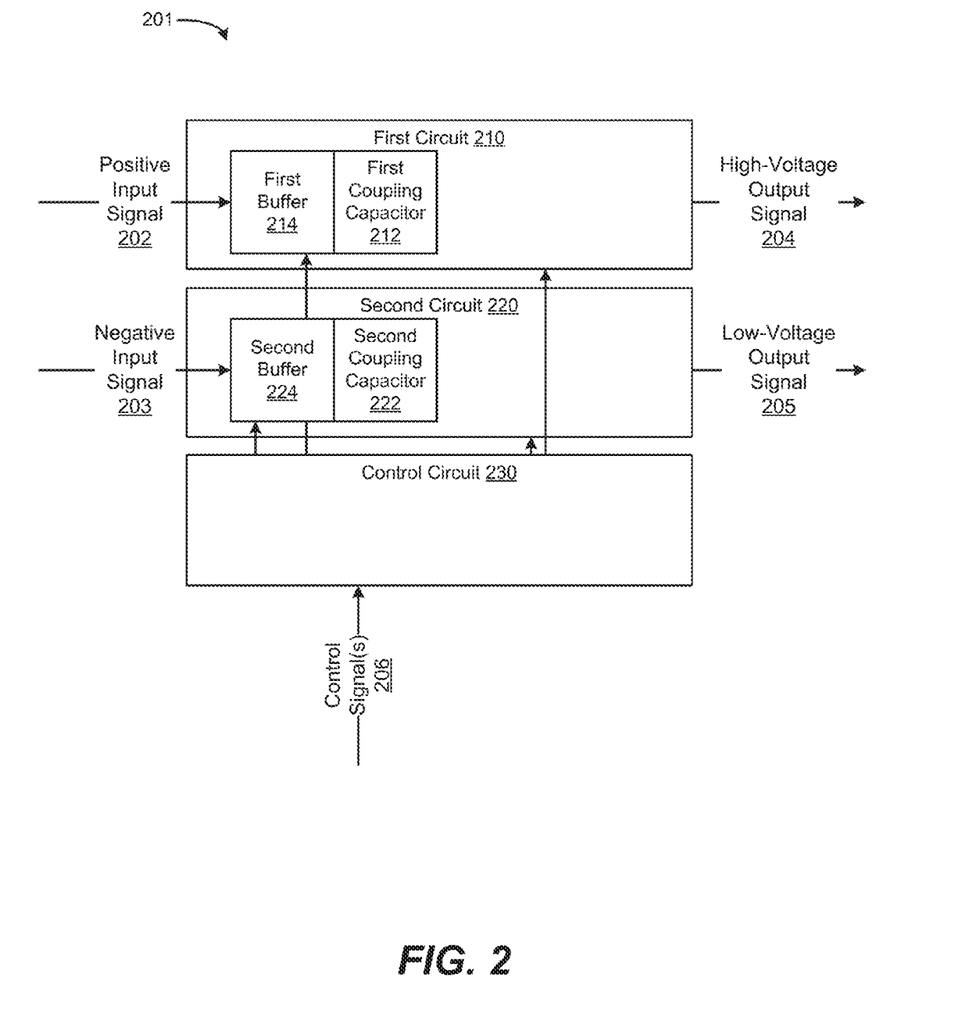
FIG. 2 is a block diagram of a segment driver circuit including a first circuit, a second circuit, and a control circuit according to an example.

FIG. 2 is a block diagram of a segment driver circuit 201 including a first circuit 210, a second circuit 220, and a control circuit 230 according to an example. The first circuit 210 includes first buffer 214 and first coupling capacitor 212, and is to receive positive input signal 202 and provide high-voltage output signal 204. The second circuit 220 includes second buffer 224 and second coupling capacitor 222, and is to receive negative input signal 203 and provide low-voltage output signal 205. The control circuit 230 is to receive control signals 206 and accordingly control first and second circuits 210, 220.

The first and second circuits 210, 220 can operate similar to the first and second circuits 110, 120 of FIG. 1, and receive their control signals from the control circuit 230, which receives and coordinates distribution of the control signals 206. For example, the control circuit 230 can receive higher-level control signals, such as reset and/or power down, and in response, selectively apply lower-level control signals to components (e.g., logic voltage 1 or 0 to enable or disable a buffer, or even an individual transistor). Additional details of such higher/lower-level control signals are described in further detail below with reference to FIG. 3.

Figure 3:
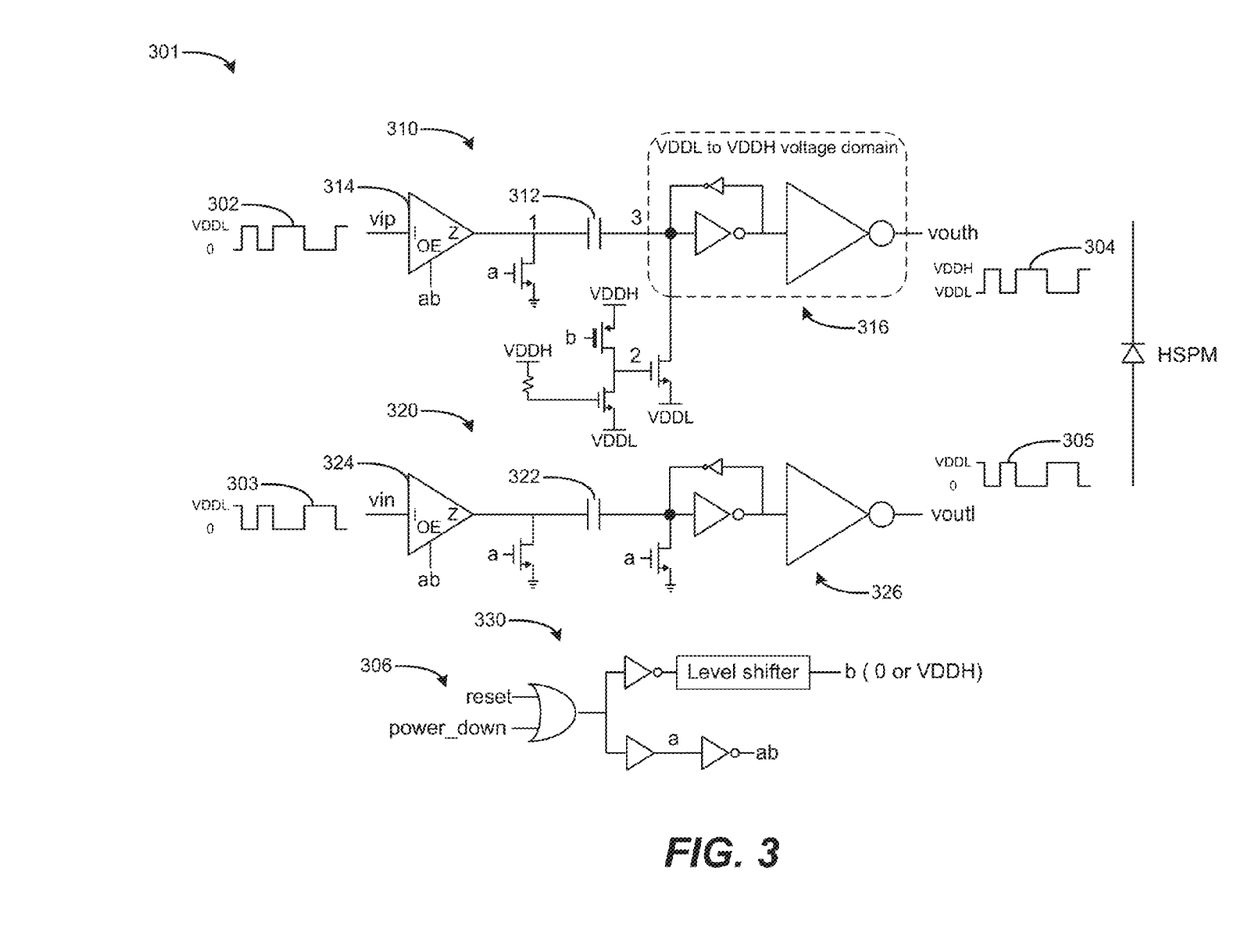
FIG. 3 is a circuit diagram of a segment driver circuit including a first circuit, a second circuit, and a control circuit according to an example.

FIG. 3 is a circuit diagram of a segment driver circuit 301 including a first circuit 310, a second circuit 320, and a control circuit 330 according to an example. The first circuit 310 includes first buffer 314, first coupling capacitor 312, and first level-shifted final driver stage circuit 316, and is to receive positive input signal 302 and provide high-voltage output signal 304. The inverter with a feedback inverter of circuit 316, together with the capacitor 312, can serve as a latch-based level shifter. The second circuit 320 includes second buffer 324, second coupling capacitor 322, and second final driver stage circuit 326 (voltage-level in 326 is not level shifted, it is designed to match circuit 316), and is to receive negative input signal 303 and provide low-voltage output signal 305. The control circuit 330 is to receive control signals 306 and provide signals a, b, and ab that are used as illustrated to control first and second circuits 310, 320. For visual clarity, labels a, b, and ab are used to indicate distribution of signals between the circuits, without specifically illustrating the control signal lines between the circuits.

The segment driver circuit 301 is an example of a push-pull segment driver. The first circuit 310, second circuit 320, and control circuit 330 enable charge reset for the first and second AC coupling capacitors 312, 322, to protect the reliability of the transistors downstream of the capacitors 312, 322 in view of initial signal toggling. The circuits 310, 320, 330 also enable power-down functionality for the segment driver circuit 301, based on cutting-off the signal path (e.g., based on first and second buffers 314, 324), even if the input signals 302, 303 are presented.

The positive and negative input signals 302, 303 (vip and yin) are complementary signals, residing in the same low voltage domain as each other. The high- and low-voltage output signals 304, 305 (vouth and voutl) are complementary signals, residing in the high voltage domain and low voltage domain, respectively.

Figure 4:
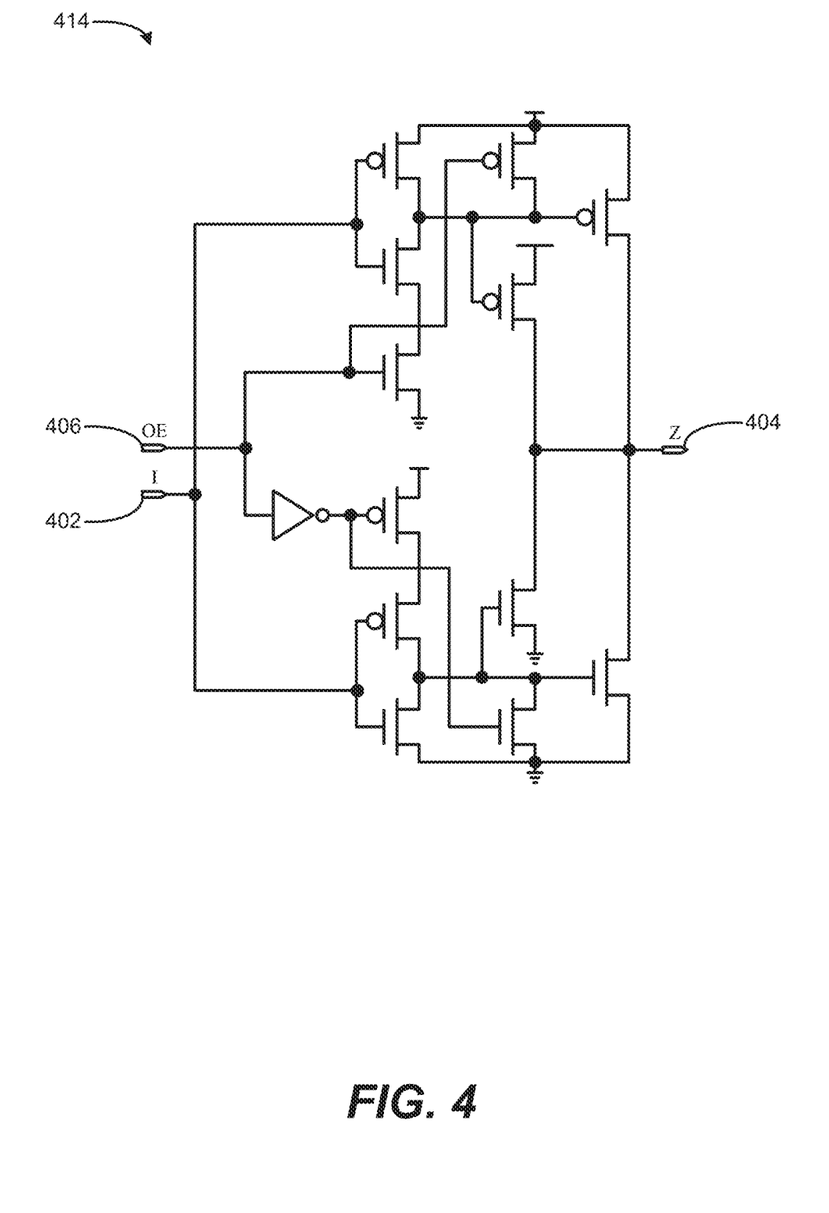
FIG. 4 is a circuit diagram of a buffer circuit according to an example.

The initial reset (rst) and power-down (pd) functions can share one circuit (the control circuit 330) as illustrated. As for interaction between the circuits and the control signals a, b, ab, the nodes located on either end of a given capacitor 312, 322, can be pulled down to voltage low at the respective voltage domain, when either one of the rst or pd signal is high. The ability to pull down the voltage of a given node is realized through the use of a buffer to isolate signals, such as an output enabled (OE) buffer (an example of which is illustrated in FIG. 4). When the ab control signal is a logic 1, the first and second buffers 314, 324 set output enable (OE)=1, thereby enabling the buffers' output and allowing the inputs 302, 303 to pass to node Z. However, when OE=0, node Z of the buffer is in a high impedance state, which allows even a small pull-down transistor (illustrated as NMOS; as referenced here and as shown in the figure, the PMOS transistor is connected to b, and the NMOS transistor is connected to a) to pull down the node's voltage to low. The benefit of using a small pull-down transistor is that high-speed operation is facilitated.

In an example implementation, the VDDL to VDDH voltage domain final driver stage circuit 316 can use a level shifter circuit and a thick-gate PMOS transistor having an always-on weak pull-down NMOS transistor. When control signal(s) rst and/or pd is logic high, then b=0 and the node labeled "2" is pre-charged to VDDH, such that the node labeled "3" is pulled down to VDDL. When control signal(s) rst or pd is low, b=VDDH, node 2 is pulled to VDDL, such that the node labeled "3" is unaffected.

FIG. 4 is a circuit diagram of a buffer circuit 414 according to an example. The buffer circuit 414 is to receive input signal 402 and control signal 406, and provide output 404. In some example implementations, the signals/values labeled as shown in FIG. 4 can correspond to the labels OE, I, and Z of buffer circuits 314 and 324 illustrated in FIG. 3. The illustrated buffer circuit 414 is one example of an output enabled buffer, and other alternative implementations can be used to provide the desired buffer functionality. Thus, the buffer circuit 414 can be turned on and off. If turned off, a high impedance is presented at the output node 404 (Z), providing a condition such that there is no output logic state, e.g., no connection to either a high or low logic state. This enables components connected to Z to be pulled to any desired level, because of the high-impedance state at output Z. This facilitates use of weak/small transistors, thereby facilitating fast operation without limiting bandwidth (as might occur if using a very large NMOS pull-down transistor that would limit the speed).

Figure 5:
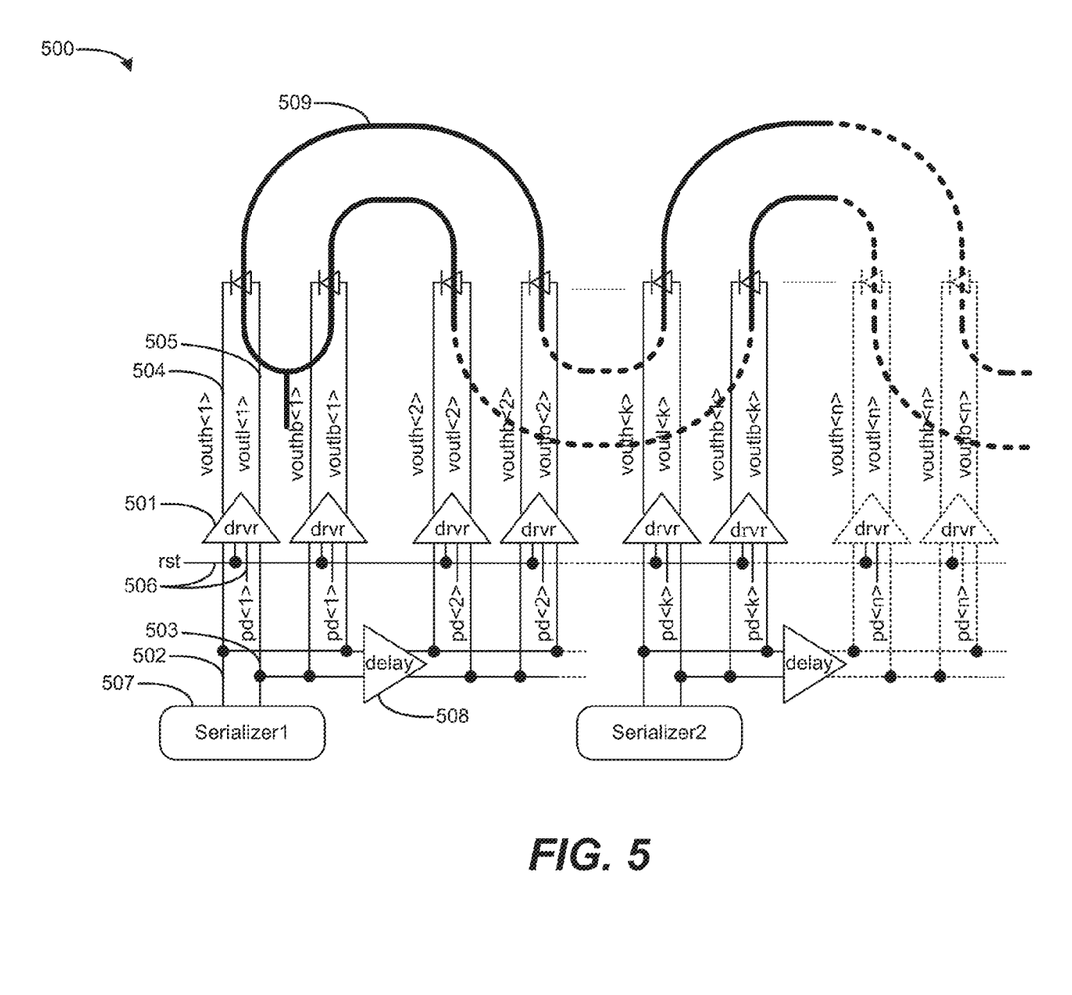
FIG. 5 is a block diagram of a segmented modulator transmitter including a plurality of segment driver circuits according to an example.

FIG. 5 is a block diagram of a segmented modulator transmitter 500 including a plurality of segment driver circuits 501 according to an example. The integrated optical and electrical circuit implementation illustrated in FIG. 5 can be referred to as a hybrid optoelectronic MZM transmitter. A MZM modulator device can include optical components such as a silicon waveguide, HSPM, p-i-n phase modulator, and grating couplers. A given segment driver circuit 501 (represented as a triangle in FIG. 5) can be represented by example driver circuit 301 illustrated in FIG. 3. A given segment driver circuit 501 is to receive positive input signal 502, negative input signal 503, and control signals 506 (e.g., reset and power down), and is to provide high-voltage output signal 504 and low-voltage output signal 505. Serializers1 and 2 507 can provide the input signals 502, 503 to a plurality of segment driver circuits 501. Delay circuits 508 can be used to separate groups of segment driver circuits 501 to match the optical propagation delay, to avoid signal quality deterioration due to delay mismatch and optical dispersion. In an example, the delay circuits 508 can be based on inverters. In some example implementations, a given segment driver circuit 501 can correspond to the example segment driver circuit 301 illustrated in FIG. 3. As to the pd<1>, pd<2>, . . . pd<n> control signals 506, such power down signals can be applied by control circuitry directly. In this manner, a given segment driver circuit 501 can be individually turned on or off, by controlling the pd signals.

As for the load of a given driver being represented in FIG. 5 as a diode, each segment corresponding to a given segment driver circuit 501 has one high-speed phase modulator device, which can be interpreted as analogous to operation of a p-n junction (diode). The two modulator devices within one segment pair are being driven by two drivers, whose inputs are connected in a complementary form. The high-speed phase modulator can serve as a lateral p-n diode ridge waveguide. The doped ridge waveguide includes a lightly doped p-n junction, and heavily doped p++ and n++ implants for contacts. Intermediate density p+ and n+ regions can be added in between, for reducing series resistance without inducing excessive optical loss.

The example electrical circuitry is well-suited for serving as a driver for the optical lumped-element high-speed phase modulator (HSPM), such as a Mach-Zehnder modulator, because the Mach-Zehnder modulator employs the illustrated segmented serpentine style, treating a given segment as a lumped element, to be driven by a given segment driver circuit 501 that can selectively be turned on and off. Such selective on/off control of segments enables the segmented modulator transmitter 500 to be configured either in NRZ signaling or PAM signaling. Additionally, the extinction ratio (ER) can be selectively controlled by turning segments on or off. For example, if a lower extinction ratio is permitted by a given application, some of the driver circuits 501 can be powered off to save power, while still providing sufficient ER (the ER being tunable).

It can be desirable to encode additional data into a given timeframe (e.g., for communication signaling), by using different signaling levels. Pulse amplitude modulation (PAM) can have multiple distinct signal levels. Non-return to zero (NRZ) is based on two levels, and can therefore be represented as a two-level (PAM-2) system. PAM-4 has four distinct signal levels, which can be used to encode two bits of data, thereby doubling the bandwidth of a connection compared to using two levels as with NRZ. The example system illustrated in FIG. 5 provides options of selectively using NRZ and PAM-4 configurability. Configure for NRZ or PAM-4 can depend on the source of the driver chains. If the inputs of the two driver chains are different, PAM-4 modulation can be configured, e.g., the system can be configured as a PAM-4 transmitter with two uncorrelated serializers. Otherwise, if the inputs are not different, NRZ can be configured, e.g., an NRZ transmitter can be configured by enabling either serializer) path or serializer2 path. A reset signal can be issued by the digital control circuit before system clocking is ready. When the drivers are in normal operating state, each driver can be individually powered down by controlling the corresponding pd<*> signal, thereby stopping it from contributing modulation of the HSPM.

Figure 6:
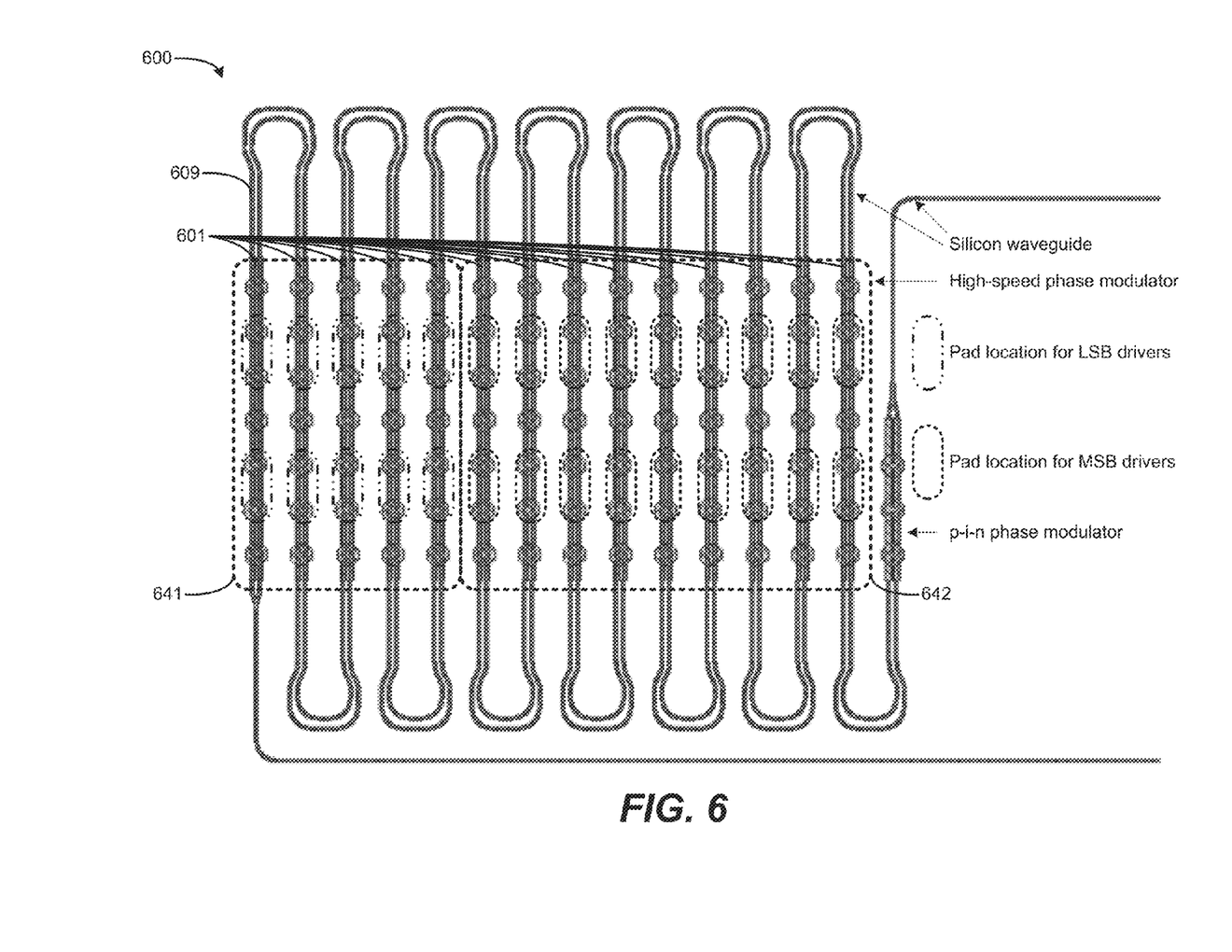
FIG. 6 is a diagram of a segmented modulator device including a plurality of segment high-speed phase modulators, low-speed phase modulators, silicon waveguides, and pad locations for driver circuits according to an example.

FIG. 6 is a diagram of a segmented modulator transmitter 600 including a silicon waveguide 609 and a plurality of segmented high-speed phase modulators (HSPM) 601 according to an example. The plurality of HSPM 601 are arranged to provide a least significant bit (LSB) 641 and a most significant bit (MSB) 642. Pad locations are illustrated by ovals, for the driving the HSPM 601 of the LSB 641 and the MSB 642. If the HSPM 601 of the LSB 641 and the MSB 642 are configured to be driven with the same pattern as each other (e.g., by how the HSPM 601 are selectively modulated), then the segmented MZM transmitter 600 is configured to provide NRZ modulation. If different patterns are used to configure the LSB 641 and MSB 642, respectively, then PAM modulation is provided.

As for the indicated pad locations, ovals are used to represent the locations where segment driver circuits can be bonded to influence and modulate the illustrated HSPM 601. For example, flip chip bonding can be used to bond a CMOS die on top of the HSPM 601 on the photonics die. Each HSPM segment pair is shown having 7 pads in total, with two ovals per HSPM pair to designate 4 of the 7 illustrated pads. Some of the pads can be used to receive the vddh signal, or vddl, or ground, etc.

As for the number of segments per bit (LSB 641 and MSB 642), the illustrated example implementation shows the LSB 641 including 5 segments, and the MSB 642 including 9 segments, for this example layout. The use of additional segments would result in an increase of the length of the device (which is shown folded accordion-style), to achieve desired optical phase modulation. The illustrated example can operate under a fixed voltage drive, whereby the length at the optical device is tuned. In alternate example implementations, the length of the modulator can be fixed, and driver amplitude can be adjusted to achieve tuning. A practical reconfigurable optical transmitter configuration having an MZM layout is achieved, capable of being configured to provide NRZ or PAM-4 modulation, achieving different ERs, by selectively turning on or off the driver segment circuits that would be placed on the photonic die to drive a segmented high-speed phase modulator (HSPM).

The serpentine-style MZM shown in FIG. 6 includes 14 lumped HSPM segments total, to be driven by the proposed driver circuits (e.g., as shown in FIG. 3). This topology can be reconfigured as follows, to provide the following features, due to the power down features of the driver circuits.

NRZ modulation can be realized by completely powering down either the 5 LSB segments, or the 9 MSB segments. Because NRZ modulation can tolerate less ER specification, segments within the powered-on LSB or MSB also can be further powered down, to adjust the ER and save power consumption. As an example, three different LSB and MSB segment combinations can be realized, using 5+9, 4+7, or 3+5 segments for the LSB 641 and MSB 642, to provide different ER specifications for PAM-4 modulation format for different application scenarios.

The segment driver circuits 301, as shown in FIG. 3, can be fabricated in a CMOS process platform, and the Mach-Zehnder modulator device 600 can be fabricated in a silicon-on-insulator (SOI) CMOS silicon photonic platform. This enables a CMOS die and a photonic die. The CMOS die, which has segment driver circuits contained in it, can be flip-chip bonded onto the photonic die using the illustrated pad locations, e.g., based on copper pillar flip-chip bonding or other suitable technology.

Figure 7:
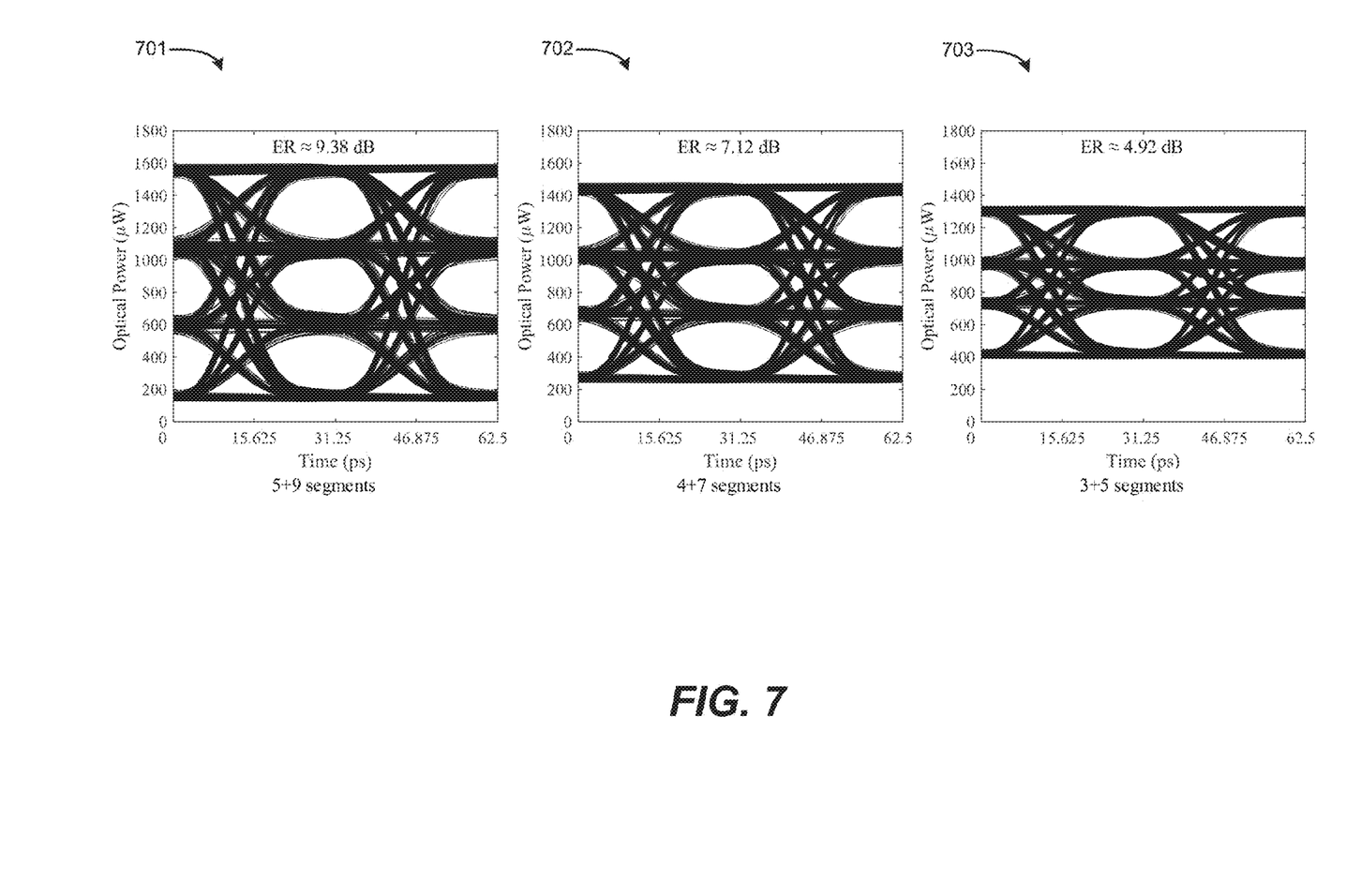
FIG. 7 is a series of PAM-4 modulation format eye diagrams corresponding to varying segment combinations of a segmented modulator transmitter according to an example.

FIG. 7 is a series of PAM-4 modulation format eye diagrams 701, 702, 703, corresponding to varying segment combinations of a segmented modulator transmitter according to an example. Eye diagram 701 corresponds to a segmented modulator transmitter having 5 LSB segments and 9 MSB segments. Eye diagram 702 corresponds to a segmented modulator transmitter having 4 LSB segments and 7 MSB segments. Eye diagram 703 corresponds to a segmented modulator transmitter having 3 LSB segments and 5 MSB segments.

Four power levels are evident in the eye diagrams 701, 702, 703, representing four levels of amplitude per diagram. Moving along the horizontal y-axis, three eyes/openings are evident. The diagrams illustrate different ERs being obtained using different LSB and MSB segment combinations for PAM-4 modulation, as well as comparing different power consumption. The simulated PAM-4 modulation format eye diagrams, corresponding to 5+9, 4+7, and 3+5 segment combinations, are shown operating at 64 Gb/s, 13 dBm (19.95 mW) laser power, with a suitable example current setting for a p-i-n phase modulator. The obtained ERs are approximately 9.38 dB, 7.12 dB, 4.92 dB, respectively. The driver power consumption is 812 mW, 638 mW and 464 mW, respectively.

By way of explanation, the ER represents the ratio of maximum power over minimum power of the optical signal, serving as a system-level specification for the transceiver. Thus, depending on the sensitivity of the receiver, the desired extinction ratio at the transmitter can be set. For example, if the sensitivity of the receiver is better, a looser specification of the ER at the transmitter side can be allowed. For achieving increased ER, a higher maximum power, e.g., optical amplitude, can be used to thereby turn on more optical segments. A given segment contributes optical phase shift, and at a given voltage and length of the device, the optical phase shift is produced. The mathematical expression of ER can be given as:

$$ER = 10\log_{10}\frac{Power_{high}}{Power_{low}}.$$

Three different extinction ratios are evident in the three eye diagrams 701, 702, 703.

Figure 8:
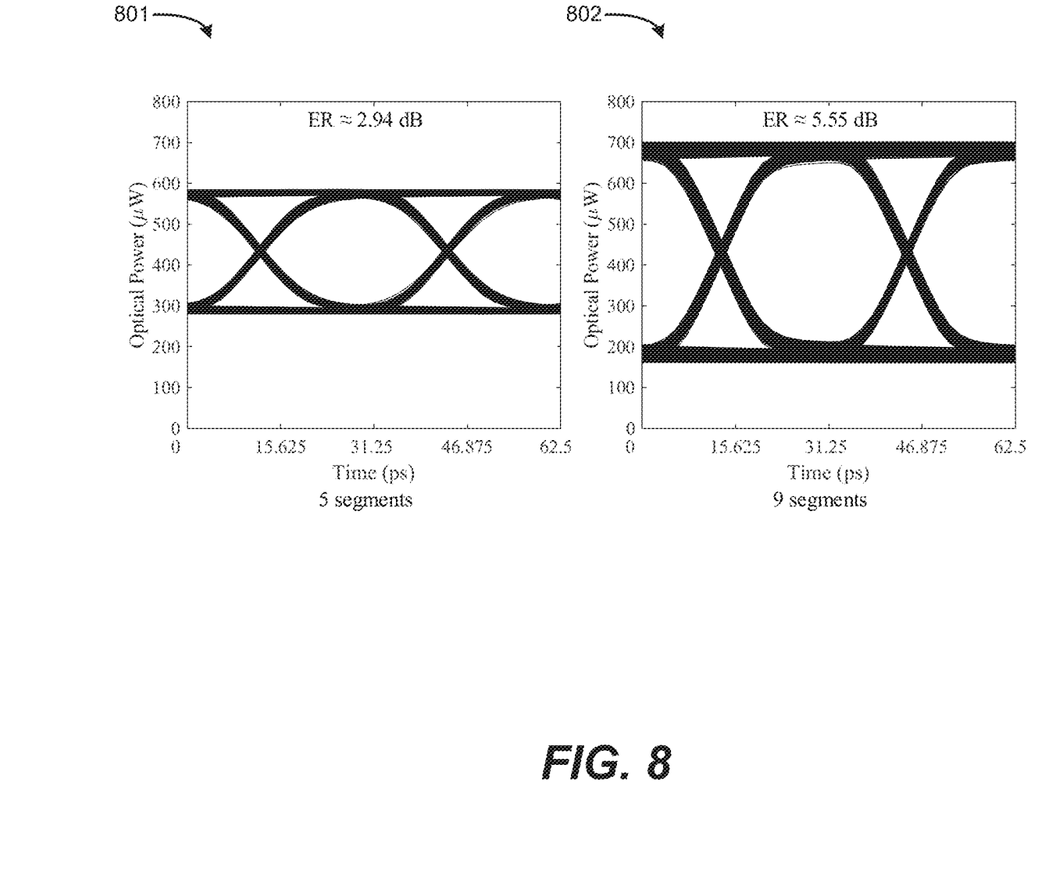
FIG. 8 is a series of NRZ modulation format eye diagrams corresponding to varying segment configurations of a segmented modulator transmitter according to an example.

FIG. 8 is a series of NRZ modulation format eye diagrams 801, 802 corresponding to varying segment configurations of a segmented modulator transmitter according to an example. Eye diagram 801 corresponds to a segmented modulator transmitter having 5 segments, and eye diagram 802 corresponds to a segmented modulator transmitter having 9 segments.

Two different amplitude levels are evident in the eye diagrams 801, 802, achieved based on simulated NRZ modulation of the 5 segments (801) and 9 segments (802), respectively, operating at 32 Gb/s, 10 dBm (10 mW) laser power. The obtained ERs are approximately 2.94 dB and 5.55 dB, respectively. The driver power consumption is 290 mW and 522 mW, respectively.

Figure 9:
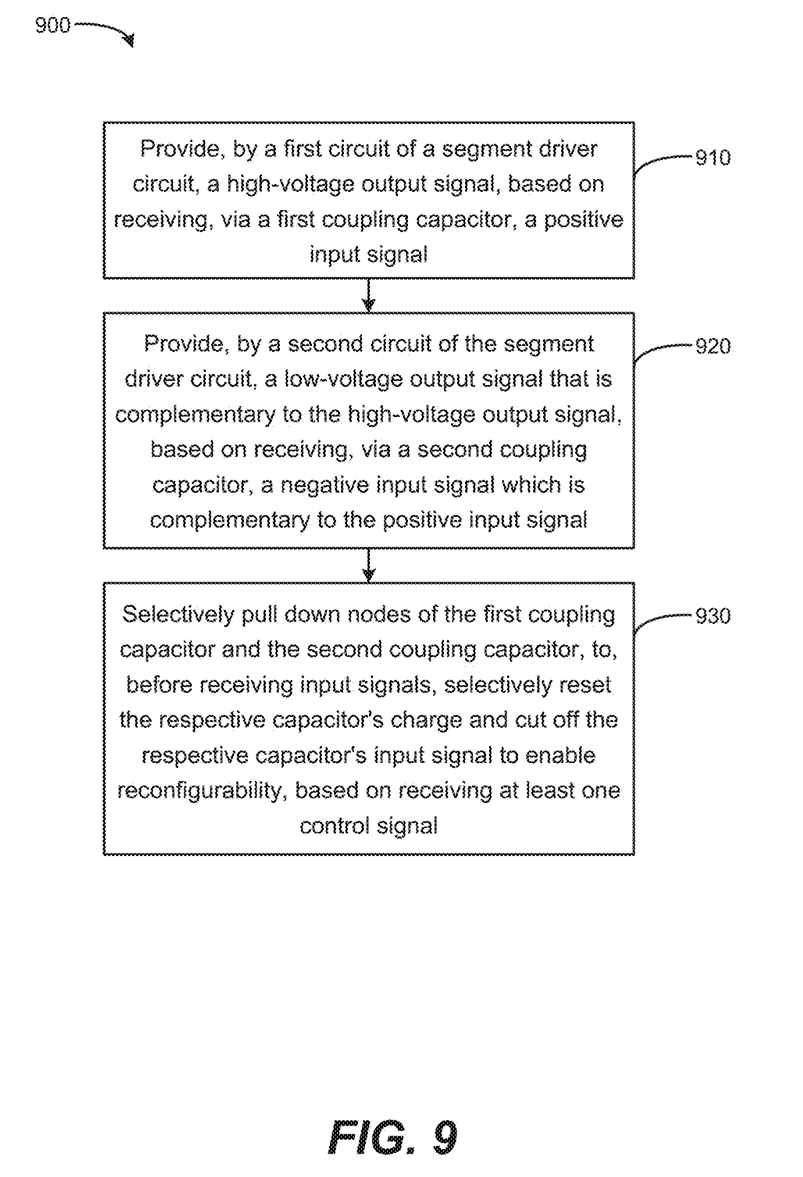
FIG. 9 is a flow chart based on selectively resetting capacitor charge or cutting off capacitor input for a segment driver circuit to enable reconfigurability according to an example.
Figure 10:
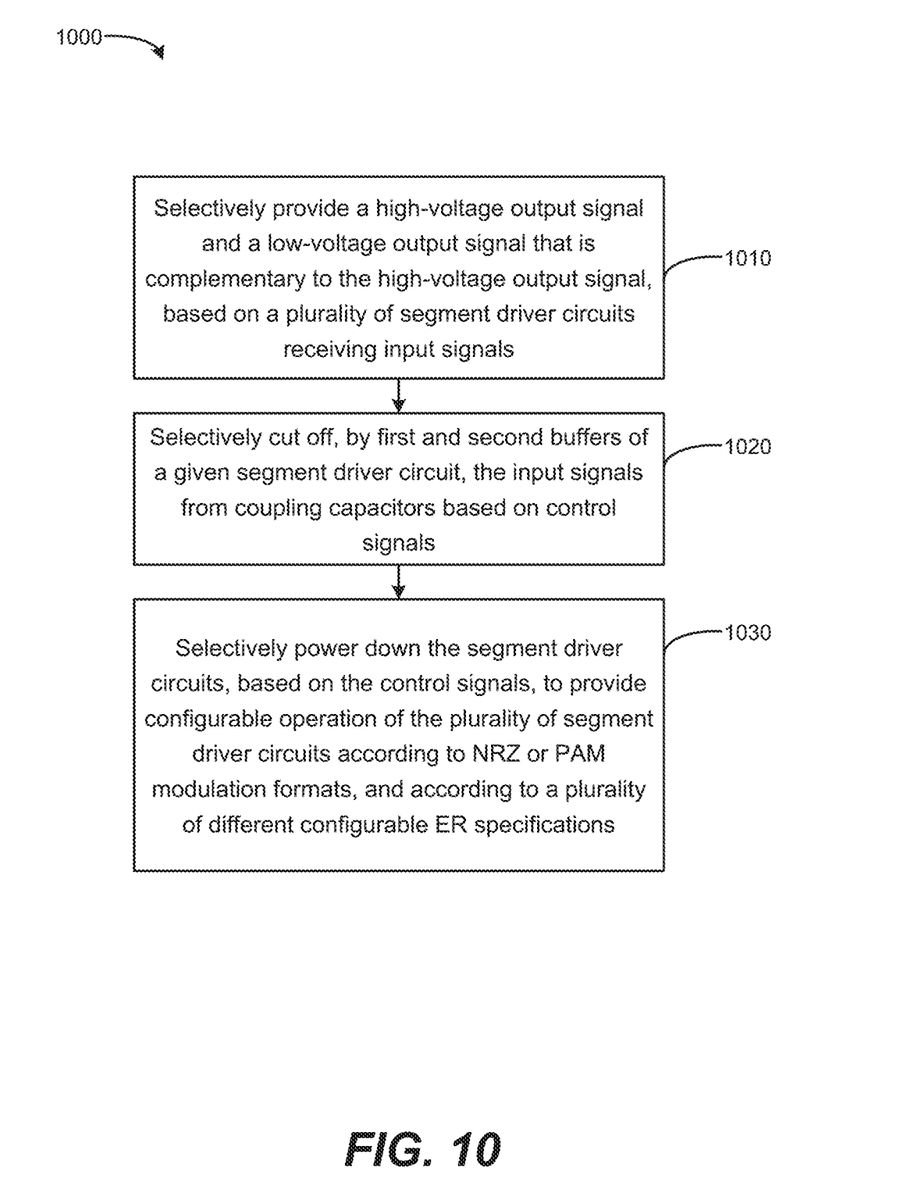
FIG. 10 is a flow chart based on providing configurable operation of segment driver circuits to enable NRZ or PAM modulation formats and a plurality of ER specifications according to an example.

Referring to FIGS. 9 and 10, flow diagrams are illustrated in accordance with various examples of the present disclosure. The flow diagrams represent processes that may be utilized in conjunction with various systems and devices as discussed with reference to the preceding figures. While illustrated in a particular order, the disclosure is not intended to be so limited. Rather, it is expressly contemplated that various processes may occur in different orders and/or simultaneously with other processes than those illustrated.

FIG. 9 is a flow chart 900 based on selectively resetting capacitor charge or cutting off capacitor input for a segment driver circuit to enable reconfigurability according to an example. In block 910, a first circuit of a segment driver circuit is to provide a high-voltage output signal, based on receiving, via a first coupling capacitor, a positive input signal. For example, a first buffer can be set to pass the positive input signal to the first coupling capacitor, which had already been pulled-down when the first buffer was in a high-impedance state in preparation for receiving the positive input signal. In block 920, a second circuit of the segment driver circuit is to provide a low-voltage output signal that is complementary to the high-voltage output signal, based on receiving, via a second coupling capacitor, a negative input signal which is complementary to the positive input signal. For example, a second buffer can be set to pass the negative input signal to the second coupling capacitor, which had already been pulled-down when the second buffer was in a high-impedance state in preparation for receiving the negative input signal. In block 930, nodes of the first coupling capacitor and the second coupling capacitor are selectively pulled down, to, before receiving input signals, selectively reset the respective capacitor's charge and cut off the respective capacitor's input signal to enable reconfigurability, based on receiving at least one control signal. For example, in a grouping of 14 segment driver circuits, the control signals can power down three of the segment driver circuits to provide 4+7 segments for PAM-4 modulation with an ER of approximately 7 dB as shown in diagram 702 of FIG. 7.

FIG. 10 is a flow chart 1000 based on providing configurable operation of segment driver circuits to enable NRZ or PAM modulation formats and a plurality of ER specifications according to an example. In block 1010, a high-voltage output signal and a low-voltage output signal that is complementary to the high-voltage output signal are selectively provided, based on a plurality of segment driver circuits receiving input signals. For example, a grouping of 14 segment driver circuits can be used to provide 14 complementary output signals to a serpentine arrangement, e.g., as shown in FIG. 5. In block 1020, first and second buffers of a given segment driver circuit are to selectively cut off the input signals from coupling capacitors based on control signals. For example, as shown in FIG. 3, control signal ab can be used to control the output enable (OE) node of the buffers 314, 324 corresponding to six of fourteen example segment driver circuits, to disable the input signals 302, 303 from the coupling capacitors 312, 322, which can be pulled down based on control signals a and b as provided by the control circuit 330. In block 1030, the segment driver circuits can be selectively powered down, based on the control signals, to provide configurable operation of the plurality of segment driver circuits according to NRZ or PAM modulation formats, and according to a plurality of different configurable ER specifications. For example, of the 14 segment driver circuits, control signals can be used to power off six of the segment driver circuits, while enabling eight segments to remain powered in a 3+5 arrangement to provide PAM-4 modulation with an ER of approximately 5 dB, as shown in diagram 703 of FIG. 7.

As set forth herein, segment driver circuits enable reconfigurable MZM transmitters to, depending on a given application, can be configured to provide NRZ or PAM modulation formats, while enabling different ER specifications to be met, which can significantly save power consumption in different scenarios.

What is claimed is:

1. A segment driver circuit comprising:
a first circuit to receive a positive input signal via a first coupling capacitor, and to provide a high-voltage output signal; and
a second circuit to receive a negative input signal, which is complementary to the positive input signal, via a second coupling capacitor for matching the positive input signal path, and to provide a low-voltage output signal that is complementary to the high-voltage output signal;
wherein the segment driver circuit is to, responsive to receipt of control signals,
selectively reset a charge of both plates of the first coupling capacitor and the second coupling capacitor,
selectively cut off from its respective circuit the positive input signal and the negative input signal, and
selectively power down to provide configurable operation of the segment driver circuit according to non-return to zero (NRZ) or pulse amplitude modulation (PAM) modulation formats, and according to a plurality of different configurable extinction ratio (ER) specifications.

2. The segment driver circuit of claim 1, further comprising a control circuit to receive the control signals, and in response, selectively pull down nodes of the first coupling capacitor and the second coupling capacitor, to selectively reset the respective capacitor's charge and cut off the respective capacitor's input signal.

3. The segment driver circuit of claim 1, further comprising:
a first buffer to selectively cut off, based on the control signals, the positive input signal from the first coupling capacitor based on the first buffer selectively providing a high impedance state or passing the positive input signal; and
a second buffer to selectively cut off, based on the control signals, the negative input signal from the second coupling capacitor based on the second buffer selectively providing a high impedance state or passing the negative input signal.

4. The segment driver circuit of claim 1, wherein the first circuit and the second circuit are implemented using low voltage metal-oxide-semiconductor field-effect transistor (MOSFET) for speed.

5. The segment driver circuit of claim 1, wherein the segment driver circuit is to drive a segment of a lumped high-speed phase modulator (HSPM) selectively configurable based on whether inputs of its two driver chains are different, wherein the lumped HSPM is configured for non-return to zero (NRZ) modulation format in response to the inputs not being different, and wherein the lumped HSPM is configured for pulse amplitude modulation (PAM) modulation format in response to the inputs being different.

6. A segmented modulator transmitter comprising:
a plurality of segment driver circuits, wherein each driver circuit can be selectively powered down to provide configurable operation of the plurality of segment driver circuits according to non-return to zero (NRZ) or pulse amplitude modulation (PAM) modulation formats, and according to a plurality of different configurable extinction ratio (ER) specifications, based on control signals, to configure operation of the modulator transmitter, wherein a given segment driver circuit comprises:
a first circuit to receive a positive input signal via a first coupling capacitor, and to provide a high-voltage output signal;
a second circuit to receive a negative input signal, which is complementary to the positive input signal, via a second coupling capacitor, and to provide a low-voltage output signal that is complementary to the high-voltage output signal; and
a control circuit to receive the control signals, and in response,
selectively pull down nodes of the first coupling capacitor and the second coupling capacitor, to selectively reset the respective capacitor's charge and cut off the respective capacitor's input signal.

7. The transmitter of claim 6, wherein the segmented modulator transmitter is a hybrid optoelectronic Mach-Zehnder Modulator (MZM) transmitter whose plurality of segment driver circuits are selectively configurable to provide NRZ or PAM modulation format, based on selectively driving segment modulators.

8. The transmitter of claim 6, wherein the segmented modulator transmitter is based on the plurality of segment driver circuits integrated into a die that is flip-chip bonded, to a silicon-based segmented high-speed phase modulator (HSPM) having a serpentine layout.

9. The transmitter of claim 6, wherein the segmented modulator transmitter includes a plurality of lumped high-speed phase modulator (HSPM) segment driver circuits, wherein at least one of the segments constitute a least significant bit (LSB), and wherein at least one of the segments constitute a most significant bit (MSB), to form a PAM-4 transmitter.

10. The transmitter of claim 9, wherein the segmented modulator transmitter is configured to provide NRZ modulation by powering down the at least one LSB segment to leave the at least one MSB segment powered, or by powering down the at least one MSB segment to leave the at least one LSB segment powered.

11. The transmitter of claim 9, wherein the segmented modulator transmitter is to provide, for PAM-4 modulation, a first (ER specification based on 5 LSB segments of the HSPM segments and 9 MSB segments of the HSPM segments remaining powered; a second ER specification based on powering down segments such that 4 LSB segments and 7 MSB segments remain powered; and a third ER specification based on powering down segments such that 3 LSB segments and 5 MSB segments remain powered.

12. The transmitter of claim 11, wherein the first ER is on the order of 9 dB, the second ER is on the order of 7 dB, and the third ER is on the order of 5 dB.

13. A method, comprising:
- providing, by a first circuit of a segment driver circuit, a high-voltage output signal, based on receiving, via a first coupling capacitor, a positive input signal;
- providing, by a second circuit of the segment driver circuit, a low-voltage output signal that is complementary to the high-voltage output signal, based on receiving, via a second coupling capacitor, a negative input signal which is complementary to the positive input signal;
- selectively pulling down nodes of the first coupling capacitor and the second coupling capacitor, to, before receiving input signals, selectively reset the respective capacitor's charge and cut off the respective capacitor's input signal to enable reconfigurability, based on receiving at least one control signal; and
- selectively powering down a plurality of segment driver circuits, including the segment driver circuit, based on the at least one control signal, to provide configurable operation of the plurality of segment driver circuits according to non-return to zero (NRZ) or pulse amplitude modulation (PAM) modulation formats, and according to a plurality of different configurable extinction ratio (ER) specifications.

14. The method of claim 13, further comprising:
- selectively cutting off, by a first buffer based on the at least one control signal, the positive input signal from the first coupling capacitor; and
- selectively cutting off, by a second buffer based on the at least one control signal, the negative input signal from the second coupling capacitor.

15. The method of claim 13, further comprising providing NRZ modulation by powering down at least one least significant bit (LSB) segment of a lumped high-speed phase modulator (HSPM) segment driver circuit to leave at least one most significant bit (MSB) segment of the lumped HSPM segment driver circuit powered, or by powering down the at least one MSB segment to leave the at least one LSB segment powered.

16. The method of claim 15, wherein the HSPM segment driver circuit is part of a plurality of lumped HSPM segment driver circuits to form a PAM-4 transmitter, and further comprising providing, for PAM-4 modulation, a first extinction ratio (ER) specification based on 5 LSB segments of the lumped HSPM segments and 9 MSB segments of the lumped HSPM segments remaining powered; a second ER specification based on powering down segments such that 4 LSB segments and 7 MSB segments remain powered; and a third ER specification based on powering down segments such that 3 LSB segments and 5 MSB segments remain powered.

* * * * *